United States Patent
Hatamura et al.

(10) Patent No.: US 8,382,942 B2
(45) Date of Patent: Feb. 26, 2013

(54) METHOD AND APPARATUS FOR REDUCING SUBSTRATE BACKSIDE DEPOSITION DURING PROCESSING

(75) Inventors: Yasunori Hatamura, Richardson, TX (US); Kunihko Hinata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 827 days.

(21) Appl. No.: 10/549,283

(22) PCT Filed: Mar. 17, 2004

(86) PCT No.: PCT/US2004/006076
§ 371 (c)(1), (2), (4) Date: Jun. 21, 2006

(87) PCT Pub. No.: WO2004/095529
PCT Pub. Date: Nov. 4, 2004

(65) Prior Publication Data
US 2007/0000614 A1    Jan. 4, 2007

Related U.S. Application Data

(60) Provisional application No. 60/456,229, filed on Mar. 21, 2003.

(51) Int. Cl.
*C23F 1/00* (2006.01)
*H01L 21/306* (2006.01)
*C23C 16/458* (2006.01)
*C23C 16/06* (2006.01)
*C23C 16/22* (2006.01)

(52) U.S. Cl. .................. 156/345.51; 118/725
(58) Field of Classification Search ............. 156/345.51; 118/728
See application file for complete search history.

(56) References Cited

U.S. PATENT DOCUMENTS

| | | | | |
|---|---|---|---|---|
| 5,271,788 A * | 12/1993 | Hasegawa et al. | ....... | 156/345.46 |
| 5,275,683 A * | 1/1994 | Arami et al. | ............ | 156/345.51 |
| 5,411,624 A * | 5/1995 | Hirano et al. | ........... | 156/345.46 |
| 5,529,657 A * | 6/1996 | Ishii | ....................... | 156/345.26 |
| 5,556,500 A * | 9/1996 | Hasegawa et al. | ....... | 156/345.27 |
| 5,740,009 A * | 4/1998 | Pu et al. | ........................ | 361/234 |
| 5,835,333 A * | 11/1998 | Castro et al. | .................. | 361/234 |
| 5,904,778 A * | 5/1999 | Lu et al. | ..................... | 118/723 R |
| 5,919,332 A * | 7/1999 | Koshiishi et al. | ......... | 156/345.47 |
| 5,922,133 A * | 7/1999 | Tepman et al. | ............... | 118/720 |
| 6,039,836 A * | 3/2000 | Dhindsa et al. | ............ | 156/345.1 |
| 6,170,429 B1 * | 1/2001 | Schoepp et al. | .......... | 118/723 R |
| 6,277,237 B1 * | 8/2001 | Schoepp et al. | ........... | 156/345.1 |

(Continued)

FOREIGN PATENT DOCUMENTS

| JP | 05190471 A * | 7/1993 |
|---|---|---|
| JP | 07245292 A * | 9/1995 |

(Continued)

OTHER PUBLICATIONS

Office Action issued Nov. 30, 2010, in China Patent Application No. 200480010683.3 (English translation only).

(Continued)

*Primary Examiner* — Rudy Zervigon
(74) *Attorney, Agent, or Firm* — Oblon, Spivak, McClelland, Maier & Neustadt, L.L.P.

(57) ABSTRACT

A focus ring assembly configured to be coupled to a substrate holder comprises a focus ring and a secondary focus ring coupled to the focus ring, wherein the secondary focus ring is configured to reduce the deposition of process residue on a backside surface of the substrate.

22 Claims, 9 Drawing Sheets

U.S. PATENT DOCUMENTS

| | | | |
|---|---|---|---|
| 6,284,093 B1* | 9/2001 | Ke et al. | 156/345.51 |
| 6,287,974 B1* | 9/2001 | Miller | 438/706 |
| 6,344,105 B1* | 2/2002 | Daugherty et al. | 156/345.51 |
| 6,364,957 B1* | 4/2002 | Schneider et al. | 118/728 |
| 6,464,794 B1* | 10/2002 | Park et al. | 118/728 |
| 6,464,843 B1* | 10/2002 | Wicker et al. | 204/192.15 |
| 6,554,954 B2* | 4/2003 | Ma et al. | 156/345.51 |
| 6,602,381 B1* | 8/2003 | Lenz | 156/345.1 |
| 6,676,804 B1* | 1/2004 | Koshimizu et al. | 156/345.53 |
| 6,689,249 B2* | 2/2004 | Ke et al. | 156/345.3 |
| 6,723,202 B2* | 4/2004 | Nagaiwa et al. | 156/345.43 |
| 6,733,624 B2* | 5/2004 | Koshiishi et al. | 438/6 |
| 6,797,109 B2* | 9/2004 | Park et al. | 156/345.37 |
| 6,828,243 B2* | 12/2004 | Denpoh | 438/706 |
| 7,025,858 B2* | 4/2006 | Chou | 156/345.51 |
| 7,338,578 B2* | 3/2008 | Huang et al. | 156/345.51 |
| 7,658,816 B2* | 2/2010 | Koshiishi et al. | 156/345.43 |
| 7,678,225 B2* | 3/2010 | Nezu et al. | 156/345.47 |
| 7,764,483 B2* | 7/2010 | Kim et al. | 361/234 |
| 7,858,155 B2* | 12/2010 | Okumura et al. | 427/523 |
| 7,882,800 B2* | 2/2011 | Koshiishi et al. | 118/723 R |
| 7,988,814 B2* | 8/2011 | Koshiishi | 156/345.43 |
| 7,988,816 B2* | 8/2011 | Koshiishi et al. | 156/345.47 |
| 8,043,472 B2* | 10/2011 | Miyagawa et al. | 156/345.51 |
| 8,124,539 B2* | 2/2012 | Endoh et al. | 438/714 |
| 2002/0029745 A1* | 3/2002 | Nagaiwa et al. | 118/723 E |
| 2002/0066531 A1* | 6/2002 | Ke et al. | 156/345.1 |
| 2002/0139478 A1* | 10/2002 | Ma et al. | 156/345.47 |
| 2002/0187647 A1* | 12/2002 | Dhindsa et al. | 438/710 |
| 2003/0010448 A1* | 1/2003 | Lee | 156/345.29 |
| 2003/0013315 A1* | 1/2003 | Park et al. | 438/710 |
| 2003/0029572 A1* | 2/2003 | Kanno et al. | 156/345.53 |
| 2003/0106646 A1* | 6/2003 | Ma et al. | 156/345.51 |
| 2003/0106647 A1* | 6/2003 | Koshiishi et al. | 156/345.53 |
| 2004/0040933 A1* | 3/2004 | Kanno et al. | 216/67 |
| 2004/0134617 A1* | 7/2004 | Wang et al. | 156/345.51 |
| 2004/0134618 A1* | 7/2004 | Endoh et al. | 156/345.51 |
| 2004/0168640 A1* | 9/2004 | Muto et al. | 118/728 |
| 2004/0177927 A1* | 9/2004 | Kikuchi et al. | 156/345.51 |
| 2004/0241995 A1* | 12/2004 | Yamanaka | 438/689 |
| 2004/0261721 A1* | 12/2004 | Steger | 118/728 |
| 2004/0261946 A1* | 12/2004 | Endoh et al. | 156/345.15 |
| 2005/0005859 A1* | 1/2005 | Koshiishi et al. | 118/728 |
| 2005/0061447 A1* | 3/2005 | Kim et al. | 156/345.51 |
| 2005/0172904 A1* | 8/2005 | Koshimizu et al. | 118/728 |
| 2006/0037701 A1* | 2/2006 | Koshiishi et al. | 156/345.44 |
| 2006/0037703 A1* | 2/2006 | Koshiishi et al. | 156/345.47 |
| 2006/0066247 A1* | 3/2006 | Koshiishi et al. | 315/111.21 |
| 2006/0151116 A1* | 7/2006 | Wu | 156/345.46 |
| 2006/0278341 A1* | 12/2006 | Park et al. | 156/345.51 |
| 2006/0281314 A1* | 12/2006 | Wickramanayaka | 438/689 |
| 2007/0000614 A1* | 1/2007 | Hatamura et al. | 156/345.51 |
| 2007/0169891 A1* | 7/2007 | Koshiishi et al. | 156/345.47 |
| 2007/0215279 A1* | 9/2007 | Koshiishi | 156/345.3 |
| 2008/0000876 A1* | 1/2008 | Park et al. | 216/67 |
| 2008/0066868 A1* | 3/2008 | Masuda | 156/345.51 |
| 2008/0236749 A1* | 10/2008 | Koshimizu et al. | 156/345.33 |
| 2010/0040768 A1* | 2/2010 | Dhindsa | 427/8 |
| 2010/0176086 A1* | 7/2010 | Iwata | 216/71 |
| 2010/0243606 A1* | 9/2010 | Koshimizu et al. | 216/67 |
| 2010/0304572 A1* | 12/2010 | Koshimizu | 438/710 |
| 2011/0116207 A1* | 5/2011 | Sato et al. | 361/234 |
| 2011/0253048 A1* | 10/2011 | Wickramanayaka | 118/723 R |
| 2012/0006488 A1* | 1/2012 | Murakami et al. | 156/345.29 |
| 2012/0175063 A1* | 7/2012 | Yamawaku et al. | 156/345.46 |
| 2012/0176692 A1* | 7/2012 | Yamawaku et al. | 359/825 |

FOREIGN PATENT DOCUMENTS

| | | | |
|---|---|---|---|
| JP | 8-339984 | | 12/1996 |
| JP | 08335567 A | * | 12/1996 |
| JP | 10-265977 | | 10/1998 |
| JP | 2001-230239 | | 8/2001 |
| JP | 2002-190466 | | 7/2002 |
| JP | 2003243366 A | * | 8/2003 |
| JP | 2005277369 A | * | 10/2005 |
| JP | 2007067353 A | * | 3/2007 |
| JP | 2011176228 A | * | 9/2011 |
| KR | 2001-0062301 | | 7/2001 |
| WO | WO 03/009363 A1 | | 1/2003 |

OTHER PUBLICATIONS

Japanese Office Action issued Aug. 23, 2011, in Patent Application No. 2006-508912 (English-language translation only).

Office Action issued May 12, 2011 in China Application No. 200480010683.3 (English Translation).

JP Office Action dated Jan. 10, 2012 in JP Application No. 2010-2024, filed Mar. 17, 2004, (w English translation only).

Notice of Dismissal of Amendment, dated Nov. 11, 2011, in co-pending KR Appl. No. 10-2005-7017575 (English Translation).

* cited by examiner

METHOD AND APPARATUS FOR REDUCING SUBSTRATE BACKSIDE DEPOSITION DURING PROCESSING

CROSS REFERENCE TO RELATED APPLICATIONS

This application claims priority to and is related to U.S. Provisional Application Ser. No. 60/456,229, filed on Mar. 21, 2003. The contents of this application is incorporated herein by reference.

FIELD OF THE INVENTION

The present invention relates to a method and apparatus for reducing substrate backside deposition during processing and more particularly to a focus ring employed in a plasma processing system to surround a substrate.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, a consumable or replaceable component, such as one fabricated from silicon, quartz, alumina, carbon, or silicon carbide, can be inserted within the processing chamber to protect the surfaces of more valuable components that would impose greater costs during frequent replacement and/or to affect changes in the process. Furthermore, it is desirable to select surface materials that minimize the introduction of unwanted contaminants, impurities, etc. to the processing plasma and possibly to the devices formed on the substrate. Often times, these consumables or replaceable components are considered part of the process kit, which is frequently maintained during system cleaning. For example, a focus ring is generally employed to rest on the substrate holder and surround the substrate, wherein the presence of the focus ring affects the processing at the edge of the substrate.

SUMMARY OF THE INVENTION

A method and apparatus for reducing substrate backside deposition during processing is described.

A focus ring assembly coupled to a substrate holder configured to support a substrate exposed to a process in a processing system comprising: a focus ring coupled to the substrate holder; and a secondary focus ring coupled to the focus ring and configured to reduce deposition of material from the process on a backside surface of the substrate.

A method of using a focus ring assembly for surrounding a substrate upon a substrate holder in a processing system comprising: installing the focus ring assembly in the processing system, wherein the focus ring assembly comprises a focus ring coupled to the substrate holder, and a secondary focus ring coupled to the focus ring and configured to reduce deposition of material from the process on a backside surface of the substrate; loading the substrate into the processing system; and processing the substrate.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

In plasma etching, a focus ring can be employed in order to affect the processing properties at the periphery of the substrate. For conventional systems, the focus ring, as described in greater detail below, simply rests atop the substrate holder adjacent the substrate, wherein its inner radius is slightly greater than the outer radius of the substrate. Typically, the focus ring comprises a material specifically chosen for the given process, such as silicon, quartz, alumina, sapphire, silicon carbide, carbon, etc.

Figure 1:
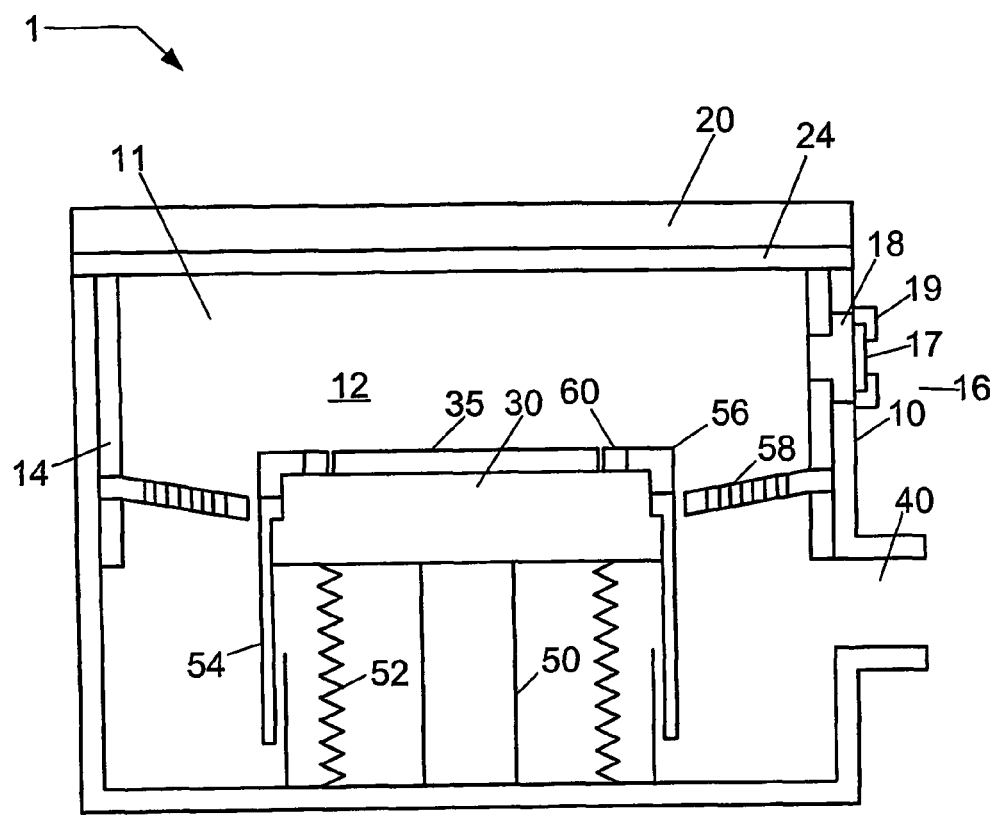
FIG. 1 illustrates a schematic block diagram of a plasma processing system according to an embodiment of the present invention.

For example, a plasma processing system 1, such as one capable of plasma etching, is depicted in FIG. 1 comprising a processing chamber 10, an upper assembly 20, an upper wall 24, a substrate holder 30 for supporting a substrate 35, and a pumping duct 40 coupled to a vacuum pump (not shown) for providing a reduced pressure atmosphere 11 in processing chamber 10. Processing chamber 10 can, for example, facilitate the formation of a processing plasma in a process space 12 adjacent substrate 35. The plasma processing system 1 can be configured to process various substrates (i.e. 200 mm substrates, 300 mm substrates, or larger).

In the illustrated embodiment, upper assembly 20 can comprise at least one of a cover, a gas injection assembly, and an upper electrode impedance match network, For example, the upper wall 24 can, for example, be configured to comprise an electrode that is coupled to a radio frequency (RF) source, and therefore facilitate an upper electrode for the plasma processing system 1. In another alternate embodiment, the upper assembly 20 comprises a cover and an upper wall 24, wherein the upper wall 24 is maintained at an electrical potential equivalent to that of the processing chamber 10. For example, the processing chamber 10, the upper assembly 20, and the upper wall 24 can be electrically connected to ground potential, and facilitate a grounded wall for the plasma processing system 1.

Processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the processing chamber 10. Optical window deposition shield 18 can extend through an opening 70 within deposition shield 14. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the processing chamber 10, and configured to seal the vertical translational device 50 from the reduced pressure atmosphere 11 in processing chamber 10. Additionally, a bellows shield 54 can, for example, be coupled to the substrate holder 30 and configured to protect the bellows 52 from a processing plasma. Substrate holder 10 can further be coupled to a focus ring 60, and, optionally, a shield ring 56. Furthermore, a baffle plate 58 can, for example, extend about a periphery of the substrate holder 30. Baffle plate 58 can be canted at an angle as shown in FIG. 1, or it can be not canted at an angle (i.e. level or flat).

Substrate 35 can be, for example, transferred into and out of processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from the substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system to substrate holder 30. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

In the illustrated embodiment, shown in FIG. 1, substrate holder 30 can comprise an electrode (not shown) through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz, for example, 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, transformer coupled plasma (TCP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
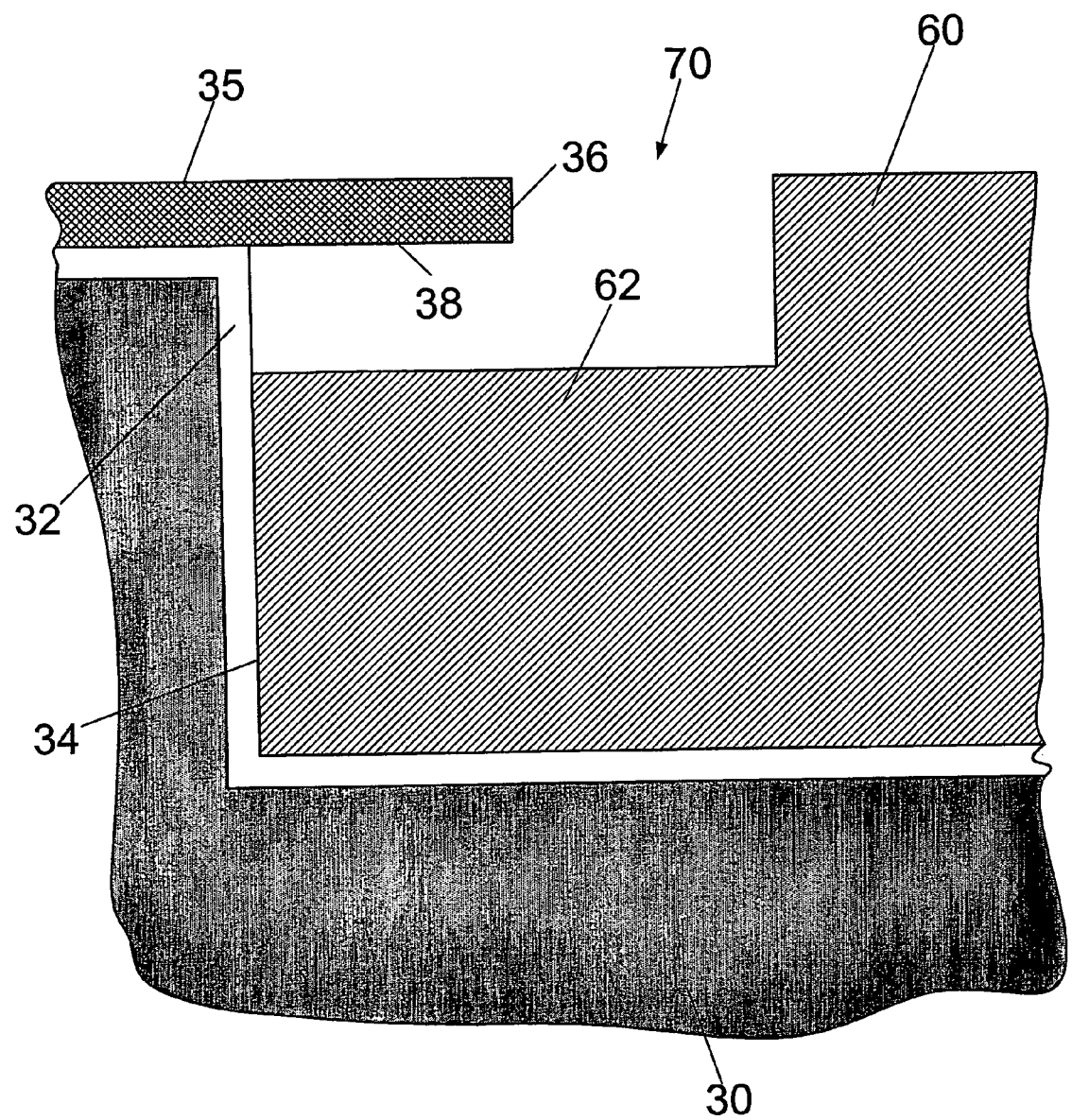
FIG. 2 presents an expanded cross-sectional view of a portion of a conventional substrate holder in a plasma processing system as shown in FIG. 1.

FIG. 2, an expanded cross-sectional view of a portion of substrate holder 30 is shown. The substrate holder 30 is configured to support substrate 35, and it is further configured to clamp substrate 35 to the substrate holder 30 using an electrostatic clamp (ESC) coupled to substrate holder 30. Substrate holder 30 can further comprise a coating layer 32. Additionally, substrate holder 30 comprises a step 34 to capture focus ring 60, wherein focus ring 60 is coupled to substrate holder 30 in order to affect the processing at the periphery of substrate 35. As illustrated in FIG. 2, substrate 35 comprises a peripheral edge 36 having a radius that extends beyond an inner radius of the step 34 in substrate holder 30 such that a backside surface 38 of substrate 35 becomes exposed. Moreover, focus ring 60 can comprise an inner lip 62 underlying the peripheral edge 36 of substrate 35, and forming a clearance space 70 there between. For example, the vertical dimension between the underside of substrate 35 and an upper surface of focus ring 60 can typically be 0.5 mm. Additionally, for example, the lateral dimension between the edge of substrate 35 and the focus ring 60 can typically be 2 mm. When processing substrate 35 and, more particularly, when etching features within a material film on substrate 35, the presence of the clearance space 70 can permit the deposition of process residue on the backside surface 38 of substrate 35. For example, these deposits are known to occur when etching low-k dielectric films such as SiLK (silicon low-k) commercially available from Dow Chemical.

Figure 3:
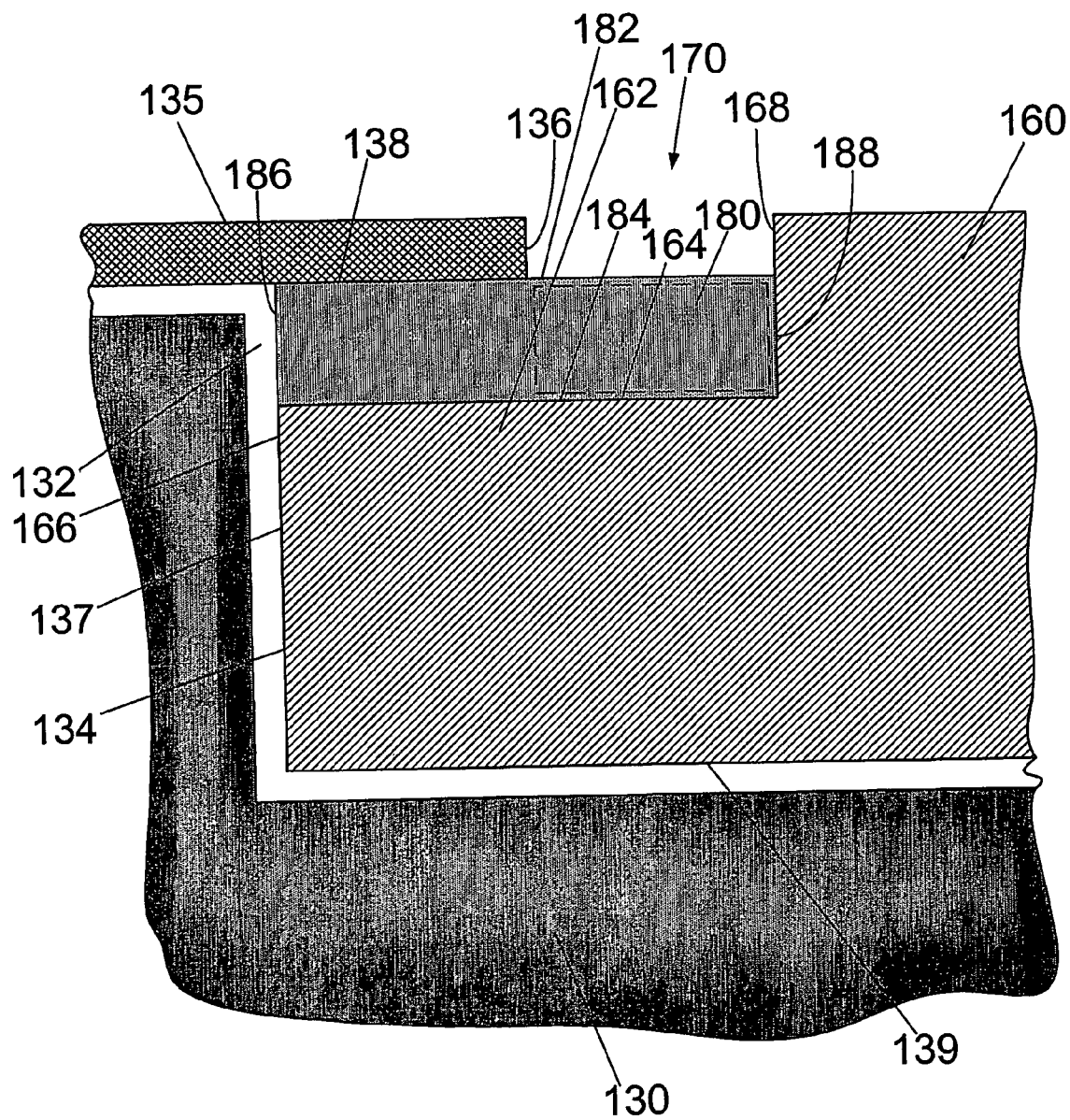
FIG. 3 presents an expanded cross-sectional view of a portion of a substrate holder for a plasma processing system according to an embodiment of the present invention.

FIG. 3 presents an expanded cross-sectional view of a portion of a substrate holder 130. The substrate holder 130 is configured to support a substrate 135, and it is further configured to clamp substrate 135 to the substrate holder 130 using an electrostatic clamp (ESC) coupled to substrate holder 130. The substrate holder 130 can further comprise a coating layer 132. Furthermore, as depicted in FIG. 3, substrate holder 130 comprises a focus ring 160 coupled to the substrate holder 130 and configured to surround substrate 135 wherein a clearance space 170 between substrate 135 and focus ring 160 is formed, and a secondary focus ring 180 coupled to focus ring 160 and configured to occupy at least a portion of clearance space 170. Substrate holder 130 comprises a step 134 having an inner radial step surface 137 and a step receiving surface 139 configured to mate with focus ring 160. Focus ring 160 comprises a lip 162 having a lip receiving surface 164 configured to receive secondary focus ring 180. The lip receiving surface 164 can extend between an inner radial lip surface 166 and an outer radial lip surface 168. Furthermore, inner radial lip surface 166 can, for example, mate with inner radial step surface 137 of substrate holder 130 as shown in FIG. 3.

As illustrated In FIG. 3, substrate 135 comprises a peripheral edge 136 having a radius that extends beyond the radius of inner radial step surface 137 in step 134 of substrate holder 130 such that a backside surface 138 of substrate 135 becomes exposed. Secondary focus ring 180 comprises an upper surface 182, a lower surface 184, an inner radial edge surface 186, and an outer radial edge surface 188. At least a portion of upper surface 182 of secondary focus ring 180 mates with backside surface 138 of substrate 135, and at least a portion of lower surface 184 mates with lip receiving surface 164. The outer radial edge need not extend to the outer radial lip surface 168 but need only extend past the peripheral edge 136.

Secondary focus ring 180 is formed from a compliant material. For example, the compliant material comprises at least one of silicone rubber, polyimide (such as Vespel), and Teflon. Alternately, secondary focus ring 180 is formed from a rigid material, wherein focus ring 160 and secondary focus ring 180 are fabricated and assembled with substrate holder 130 with sufficient tolerances to avoid fracture of substrate 135 during clamping. For example, the rigid material comprises at least one of silicon, silicon carbide, silicon nitride, silicon dioxide, and carbon. Alternately, secondary focus ring 180 is formed from silicon having a resistivity equal to or less than 20 Ω-cm. Alternately, secondary focus ring 180 is formed from silicon having a resistivity equal to or less than 2 Ω-cm. Alternately, secondary focus ring 180 is formed from silicon having a resistivity equal to or less than 0.020 Ω-cm.

Figure 4:
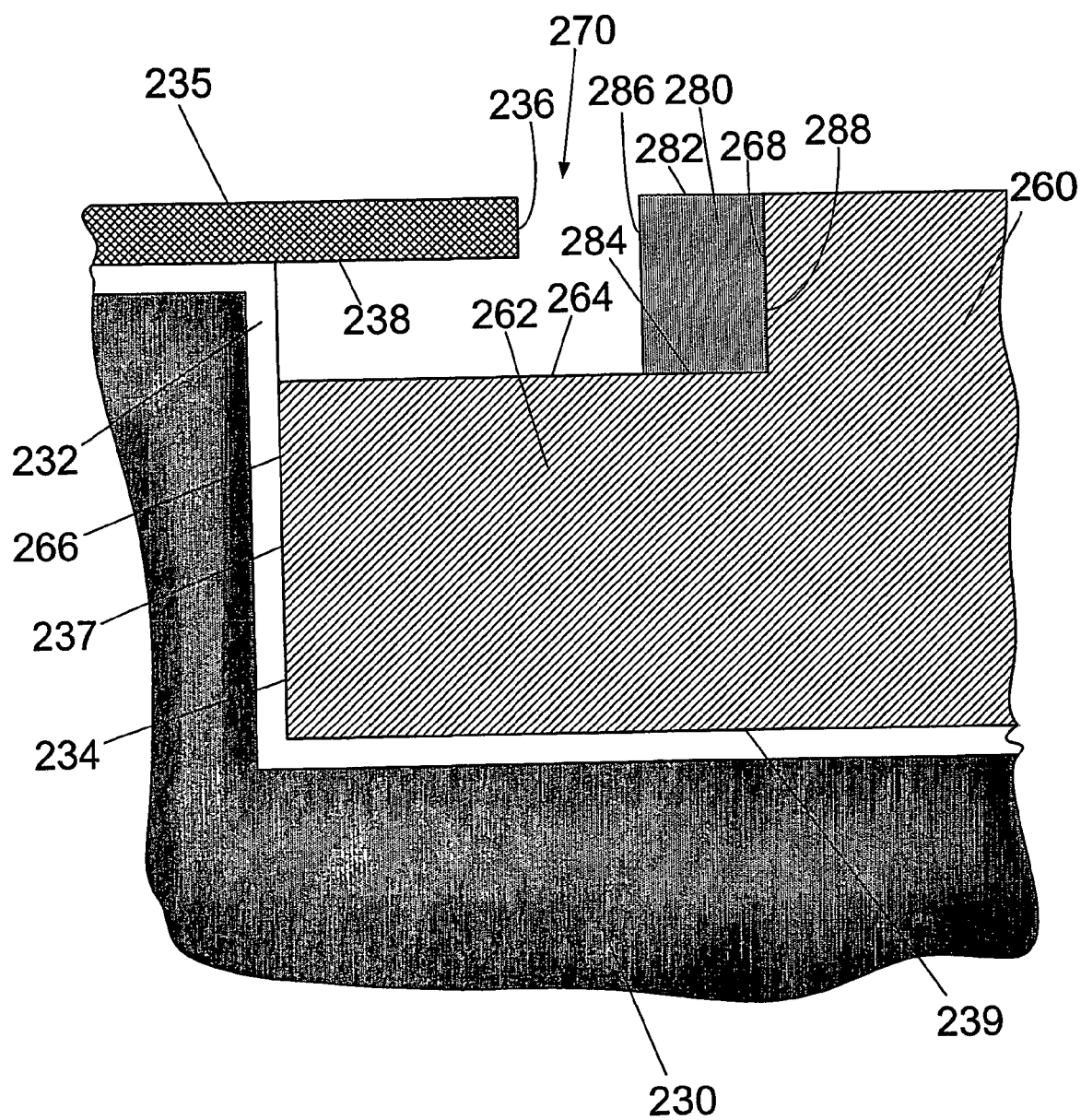
FIG. 4 presents an expanded cross-sectional view of a portion of a substrate holder for a plasma processing system according to an embodiment of the present invention.

In another embodiment, FIG. 4 presents an expanded cross-sectional view of a portion of a substrate holder 230. The substrate holder 230 is configured to support a substrate 235, and it is further configured to clamp substrate 235 to the substrate holder 230 using an electrostatic clamp (ESC) coupled to substrate holder 230. The substrate holder 230 can further comprise a coating layer 232. Furthermore, as depicted in FIG. 4, substrate holder 230 comprises a focus ring 260 coupled to the substrate holder 230 and configured to surround substrate 235 wherein a clearance space 270 between substrate 235 and focus ring 260 is formed, and a secondary focus ring 280 coupled to focus ring 260 and configured to occupy at least a portion of clearance space 270. Substrate holder 230 comprises a step 234 having an inner radial step surface 237 and a step receiving surface 239 configured to mate with focus ring 260. Focus ring 260 comprises a lip 262 having a receiving surface 264 configured to receive secondary focus ring 280. The receiving surface 264 can extend between an inner radial lip surface 266 and an outer radial lip surface 268. Furthermore, inner radial lip surface 266 can, for example, mate with inner radial step surface 237 of substrate holder 230 as shown in FIG. 4.

As illustrated in FIG. 4, substrate 235 comprises a peripheral edge 236 having a radius that extends beyond the radius of inner radial step surface 237 in step 234 of substrate holder 230 such that a backside surface 238 of substrate 235 becomes exposed. Secondary focus ring 280 comprises an upper surface 282, a lower surface 284, an inner radial edge surface 286, and an outer radial edge surface 288. At least a portion of lower surface 284 mates with step receiving surface 264.

Secondary focus ring 280 is formed from a rigid material. For example, the rigid material comprises at least one of silicon, silicon carbide, silicon nitride, silicon dioxide, and carbon. Alternately, secondary focus ring 280 is formed from a compliant material. For example, the compliant material comprises at least one of silicone rubber, polyimide (such as Vespel), and Teflon. Alternately, secondary focus ring 280 is formed from silicon having a resistivity equal to or less than 20 Ω-cm. Alternately, secondary focus ring 280 is formed from silicon having a resistivity equal to or less than 2 Ω-cm. Alternately, secondary focus ring 280 is formed from silicon having a resistivity equal to or less than 0.020 Ω-cm.

Figure 5:
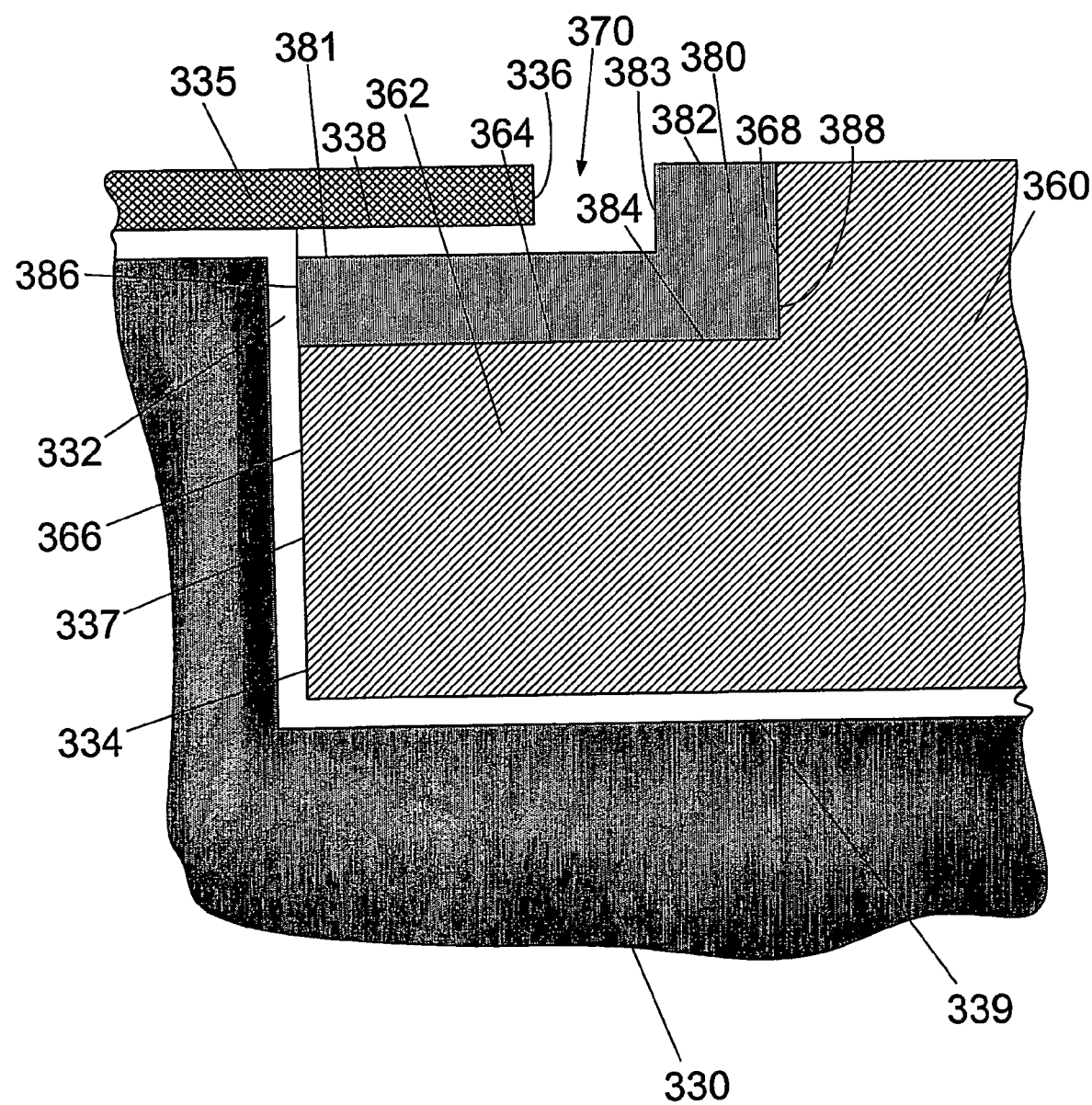
FIG. 5 presents an expanded cross-sectional view of a portion of a substrate holder for a plasma processing system according to an embodiment of the present invention.

In another embodiment, FIG. 5 presents an expanded cross-sectional view of a portion of a substrate holder 330. The substrate holder 330 is configured to support a substrate 335, and it is further configured to clamp substrate 335 to the substrate holder 330 using an electrostatic clamp (ESC) coupled to substrate holder 330. The substrate holder 330 can further comprise a coating layer 332. Furthermore, as depicted in FIG. 5, substrate holder 330 comprises a focus ring 360 coupled to the substrate holder 330 and configured to surround substrate 335 wherein a clearance space 370 between substrate 335 and focus ring 360 is formed, and a secondary focus ring 380 coupled to focus ring 360 and configured to occupy at least a portion of clearance space 370. Substrate holder 330 comprises a step 334 having an inner radial step surface 337 and a step receiving surface 339 configured to mate with focus ring 360. Focus ring 360 comprises a lip 362 having a receiving surface 364 configured to receive secondary focus ring 380. The receiving surface 364 can extend between an inner radial lip surface 366 and an outer radial lip surface 368. Furthermore, inner radial lip surface 366 can, for example, mate with inner radial step surface 337 of substrate holder 330 as shown in FIG. 5.

As illustrated in FIG. 5, substrate 335 comprises a peripheral edge 336 having a radius that extends beyond the radius of inner radial step surface 337 in step 334 of substrate holder 330 such that a backside surface 338 of substrate 335 becomes exposed. Secondary focus ring 380 comprises a first upper surface 381, a second upper surface 382 coupled to the first upper surface 381 via an upper radial surface 383, a lower surface 384, an inner radial edge surface 386, and an outer radial edge surface 388. At least a portion of lower surface 384 mates with step receiving surface 364.

Secondary focus ring 380 is formed from a rigid material. For example, the rigid material comprises at least one of silicon, silicon carbide, silicon nitride, silicon dioxide, and carbon. Alternately, secondary focus ring 380 is formed from a compliant material. For example, the compliant material comprises at least one of silicone rubber, polyimide (such as Vespel), and Teflon. Alternately, secondary focus ring 380 is formed from silicon having a resistivity equal to or less than 20 Ω-cm. Alternately, secondary focus ring 380 is formed from silicon having a resistivity equal to or less than 2 Ω-cm. Alternately, secondary focus ring 380 is formed from silicon having a resistivity equal to or less than 0.020 Ω-cm.

Figure 6:
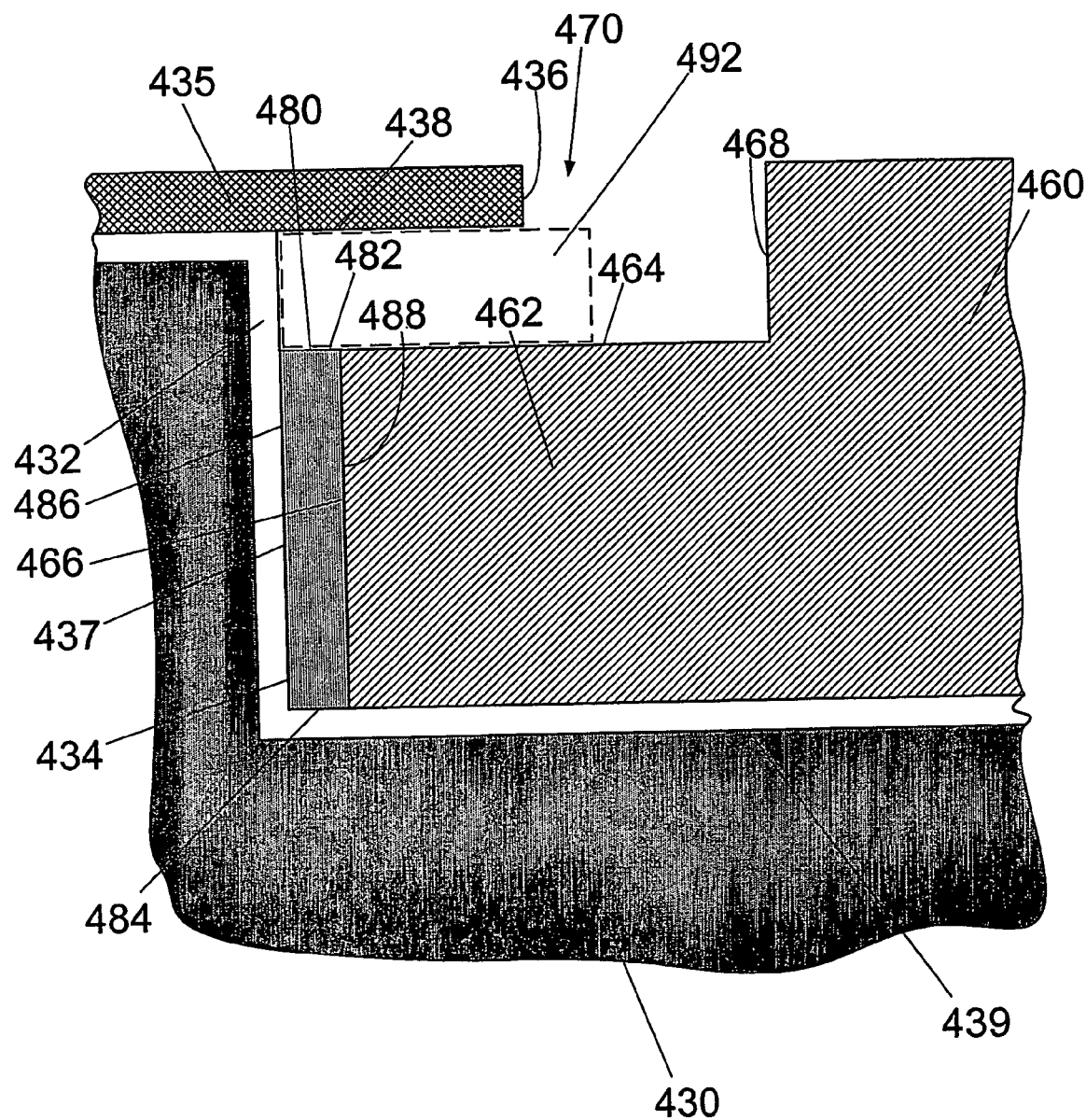
FIG. 6 presents an expanded cross-sectional view of a portion of a substrate holder for a plasma processing system according to an embodiment of the present invention.

In another embodiment, FIG. 6 presents an expanded cross-sectional view of a portion of a substrate holder 430. The substrate holder 430 is configured to support a substrate 435, and it is further configured to clamp substrate 435 to the substrate holder 430 using an electrostatic clamp (ESC)

coupled to substrate holder 430. The substrate holder 430 can further comprise a coating layer 432. Furthermore, as depicted in FIG. 6, substrate holder 430 comprises a focus ring 460 coupled to the substrate holder 430 and configured to surround substrate 435 wherein a clearance space 470 between substrate 435 and focus ring 460 is formed, and a secondary focus ring 480 coupled to focus ring 460 and configured to be interposed between the focus ring 460 and the substrate holder 430. Substrate holder 430 comprises a step 434 having an inner radial step surface 437 and a step receiving surface 439 configured to mate with focus ring 460. Focus ring 460 comprises a lip 462 having a receiving surface 464. The receiving surface 464 can extend between an inner radial lip surface 466 and an outer radial lip surface 468, wherein the inner radial lip surface 466 mates with the secondary focus ring 480 as shown in FIG. 6.

As illustrated in FIG. 6, substrate 435 comprises a peripheral edge 436 having a radius that extends beyond the radius of inner radial step surface 437 in step 434 of substrate holder 430 such that a backside surface 438 of substrate 435 becomes exposed. Secondary focus ring 480 comprises an upper surface 482, a lower surface 484, an inner radial edge surface 486, and an outer radial edge surface 488. At least a portion of outer radial edge surface 488 mates with inner radial step surface 466, and at least a portion of lower surface 484 mates with step receiving surface 439. The secondary focus ring 480 may optionally include a protective portion 492 interposed between the focus ring 460 and the substrate 435.

Secondary focus ring 480 is formed from a rigid material. For example, the rigid material comprises at least one of silicon, silicon carbide, silicon nitride, silicon dioxide, and carbon. Alternately, secondary focus ring 480 is formed from a compliant material. For example, the compliant material comprises at least one of silicone rubber, polyimide (such as Vespel), and Teflon. Alternately, secondary focus ring 480 is formed from silicon having a resistivity equal to or less than 20 $\Omega$-cm. Alternately, secondary focus ring 480 is formed from silicon having a resistivity equal to or less than 2 $\Omega$-cm. Alternately, secondary focus ring 480 is formed from silicon having a resistivity equal to or less than 0.020 $\Omega$-cm.

Figure 7:
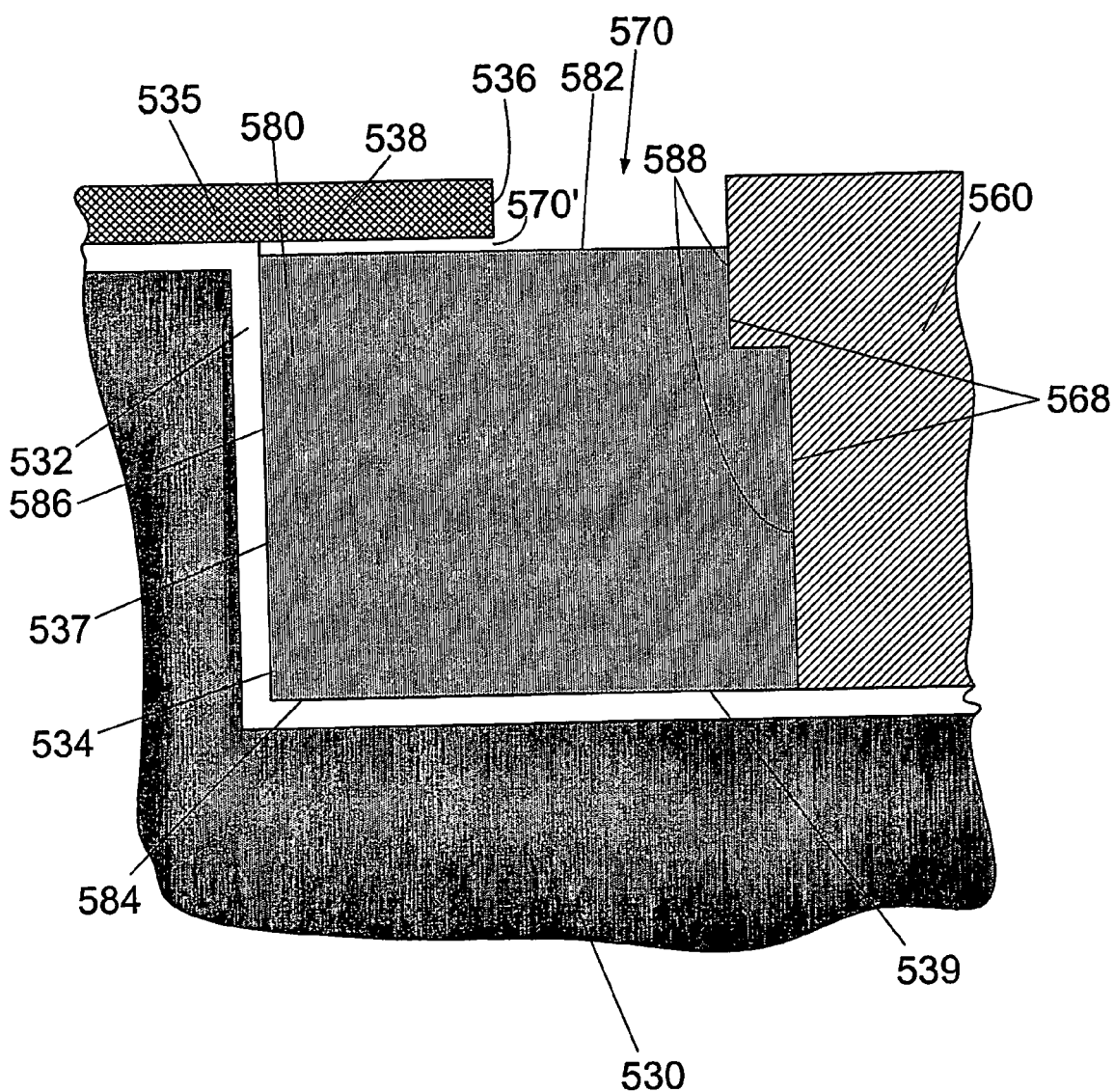
FIG. 7 presents an expanded cross-sectional view of a portion of a substrate holder for a plasma processing system according to an embodiment of the present invention.

In another embodiment, FIG. 7 presents an expanded cross-sectional view of a portion of a substrate holder 530. The substrate holder 530 is configured to support a substrate 535, and it is further configured to clamp substrate 535 to the substrate holder 530 using an electrostatic clamp (ESC) coupled to substrate holder 530. The substrate holder 530 can further comprise a coating layer 532. Furthermore, as depicted in FIG. 7, substrate holder 530 comprises a focus ring 560 coupled to the substrate holder 530 and configured to surround substrate 535 wherein a clearance space 570 between substrate 535 and focus ring 560 is formed, and a secondary focus ring 580 coupled to focus ring 560, configured to be interposed between the focus ring 560 and the substrate holder 530, and configured to affect a reduced clearance space 570' between substrate 535 and an upper surface thereof. Substrate holder 530 comprises a step 534 having an inner radial step surface 537 and a step receiving surface 539 configured to receive focus ring 560 and secondary focus ring 580. Focus ring 560 comprises an inner radial mating surface 568 configured to mate with secondary focus ring 580.

As illustrated in FIG. 7, substrate 535 comprises a peripheral edge 536 having a radius that extends beyond the radius of inner radial step surface 537 in step 534 of substrate holder 530 such that a backside surface 538 of substrate 535 becomes exposed. Secondary focus ring 580 comprises an upper surface 582, a lower surface 584, an inner radial edge surface 586, and an outer radial edge surface 588. At least a portion of outer radial edge surface 588 mates with inner radial mating surface 568, and at least a portion of lower surface 584 mates with step receiving surface 539.

Secondary focus ring 580 is formed from a rigid material. For example, the rigid material comprises at least one of silicon, silicon carbide, silicon nitride, silicon dioxide, and carbon. Alternately, secondary focus ring 580 is formed from a compliant material. For example, the compliant material comprises at least one of silicone rubber, polyimide (such as Vespel), and Teflon. Alternately, secondary focus ring 580 is formed from silicon having a resistivity equal to or less than 20 $\Omega$-cm. Alternately, secondary focus ring 580 is formed from silicon having a resistivity equal to or less than 2 $\Omega$-cm. Alternately, secondary focus ring 580 is formed from silicon having a resistivity equal to or less than 0.020 $\Omega$-cm.

Figure 8:
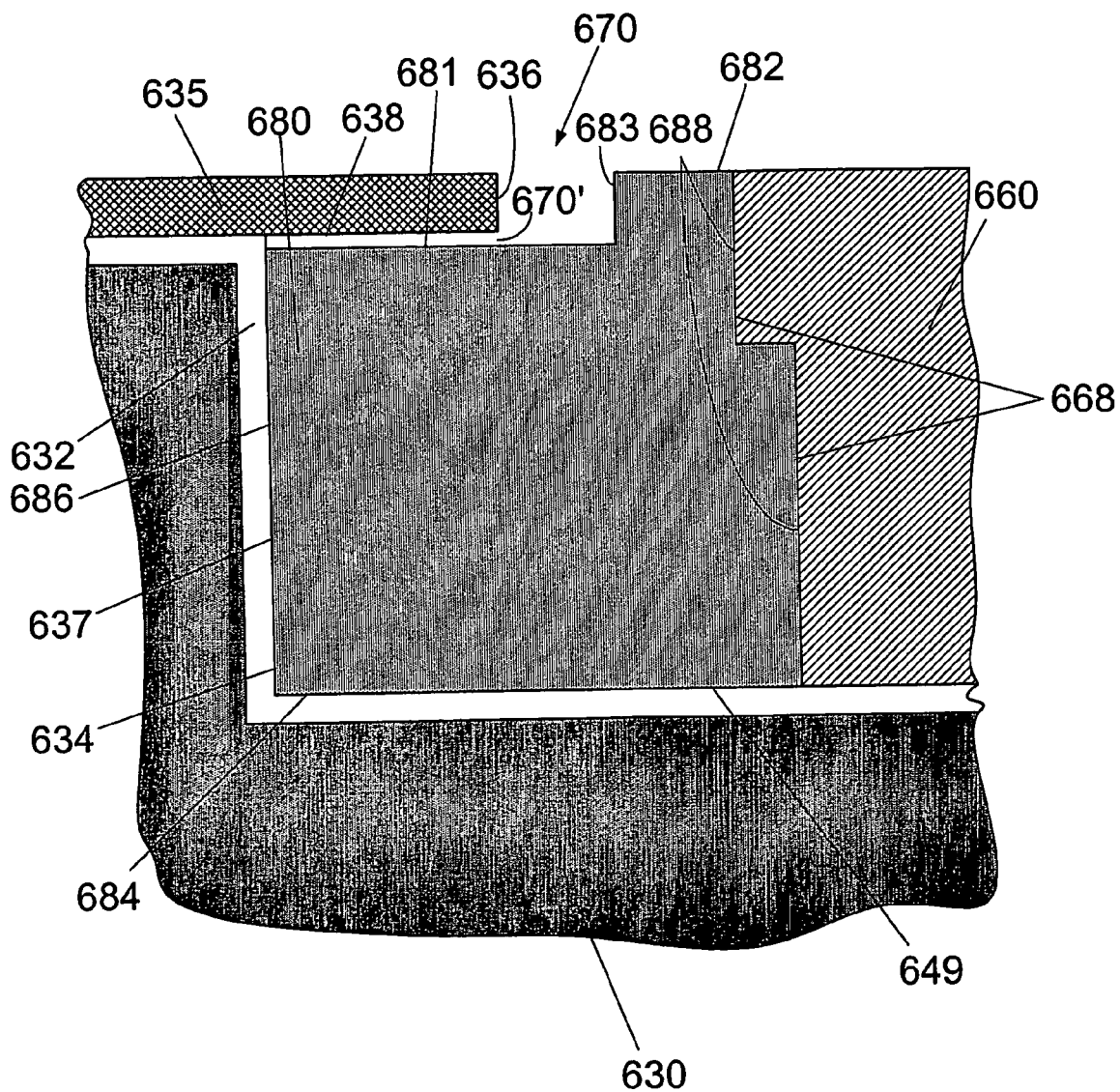
FIG. 8 presents an expanded cross-sectional view of a portion of a substrate holder for a plasma processing system according to an embodiment of the present invention.

In another embodiment, FIG. 8, presents an expanded cross-sectional view of a portion of a substrate holder 630. The substrate holder 630 is configured to support a substrate 635, and it is further configured to clamp substrate 635 to the substrate holder 630 using an electrostatic clamp (ESC) coupled to substrate holder 630. The substrate holder 630 can further comprise a coating layer 632. Furthermore, as depicted in FIG. 8, substrate holder 630 comprises a focus ring 660 coupled to the substrate holder 630 and configured to surround substrate 635 wherein a clearance space 670 between substrate 635 and focus ring 660 is formed, and a secondary focus ring 680 coupled to focus ring 660, configured to be interposed between the focus ring 660 and the substrate holder 630, and configured to affect a reduced clearance space 670' between substrate 635 and an upper surface thereof. Substrate holder 630 comprises a step 634 having an inner radial step surface 637 and a step receiving surface 639 configured to receive focus ring 660 and secondary focus ring 680. Focus ring 660 comprises an inner radial mating surface 668 configured to mate with secondary focus ring 680.

As illustrated in FIG. 8, substrate 635 comprises a peripheral edge 636 having a radius that extends beyond the radius of inner radial step surface 637 in step 634 of substrate holder 630 such that a backside surface 638 of substrate 635 becomes exposed. Secondary focus ring 680 comprises a first upper surface 681, a second upper surface 682 coupled to the first upper surface 681 via an upper radial surface 683, a lower surface 684, an inner radial edge surface 686, and an outer radial edge surface 688. At least a portion of outer radial edge surface 688 mates with inner radial mating surface 668, and at least a portion of lower surface 684 mates with step receiving surface 639.

Secondary focus ring 680 is formed from a rigid material. For example, the rigid material comprises at least one of silicon, silicon carbide, silicon nitride, silicon dioxide, and carbon. Alternately, secondary focus ring 680 is formed from a compliant material. For example, the compliant material comprises at least one of silicone rubber, polyimide (such as Vespel), and Teflon. Alternately, secondary focus ring 680 is formed from silicon having a resistivity equal to or less than 20 $\Omega$-cm. Alternately, secondary focus ring 680 is formed from silicon having resistivity equal to or less than 2 $\Omega$-cm. Alternately, secondary focus ring 680 is formed from silicon having a resistivity equal to or less than 0.020 $\Omega$-cm.

In FIGS. 3 through 8, focus rings 160, 260, 360, 460, 560, and 660, and secondary focus rings 180, 280, 380, 480, 580, and 680 can, for example, be fabricated using at least one of machining, polishing, and grinding. For example, each focus ring and secondary focus ring described above can be machined according to specifications set forth on a mechanical drawing, using conventional techniques including a mill, etc. The techniques for machining a component using, for example, a mill, are well known to those skilled in the art of machining such materials. Focus rings may also include gas channels for providing gas into a clearance space (e.g., 270) to further remove particles that might otherwise accumulate on the backside of the substrate.

In an example, the thickness of the substrate backside deposition was measured for several focus ring assembly configurations, each focus ring assembly comprising a focus ring and a secondary focus ring. A multi-step process recipe was executed for both bare silicon substrates and blanket photoresist (PR) on silicon substrates with several of the above-described configurations. The multi-step process recipe comprised the following steps: Chamber pressure=60 mTorr, Upper electrode RF power=2200 W, Lower electrode RF power=1800 W, Process gas flow rate $CF_4/O_2/Ar$=150/20/800 sccm, a 30 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 50 seconds; Chamber pressure=300 mTorr, Upper electrode RF power=1500 W, Lower electrode RF power=1200 W, Process gas flow rate $N_2/H_2$=500/100 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 65 seconds; Chamber pressure=50 mTorr, Upper electrode RF power=1000 W, Lower electrode RF power=100 W. Process gas flow rate $CH_2F_2/O_2/Ar$=20/40/200 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 17 seconds; Chamber pressure=50 mTorr, Upper electrode RF power=1000 W, Lower electrode RF power=100 W, Process gas flow rate $CH_2F_2/CF_4/O_2/Ar$=20/20/20/200 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 20 seconds; Chamber pressure=800 mTorr, Upper electrode RF power=1500 W, Lower electrode RF power=1200 W, Process gas flow rate $N_2/H_2$=300/300 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 29 seconds; Chamber pressure=50 mTorr, Upper electrode RF power=1000 W, Lower electrode RF power=100 W, Process gas flow rate $CH_2F_2/O_2/Ar$=25/20/200 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 15 seconds; and Chamber pressure=800 mTorr, Upper electrode RF power=1500 W, Lower electrode RF power=1200 W, Process gas flow rate $N_2/H_2$=300/300 sccm, a 55 mm electrode spacing between the lower surface of an upper electrode and the upper surface of the substrate on the substrate holder, Lower electrode temperature (e.g., substrate holder)=0 C, Upper electrode temperature=30 C, Chamber wall temperature=50 C, Backside helium pressure Center/Edge=10/35 Torr, and an etch time of 7 seconds.

Table I presents the measured thickness (nm) of the substrate backside deposition for each configuration described and the two different types of substrates.

TABLE I

| TEST EVALUATION CASE | REFERENCE | Polymer (Bare-Si) THICKNESS (nm) | Polymer (PR) THICKNESS (nm) |
|---|---|---|---|
| STANDARD | FIG. 2 | 35-55 | 77 |
| EVAL01 | FIG. 3 | 0 | 0 |
| EVAL02 | FIG. 4 | <10/34 | 59 |
| EVAL03 | FIG. 5 | 36 | NA |
| EVAL04 | FIG. 6 | 36 | NA |
| EVAL05 | FIG. 7 | 34 | NA |
| EVAL06 | FIG. 8 | 17 | NA |
| STANDARD (0.005 Ω-cm) | NA | 29 | NA |
| STANDARD (1.500 Ω-cm) | NA | 30 | NA |
| STANDARD (18.00 Ω-cm) | NA | 40 | NA |

Figure 9:
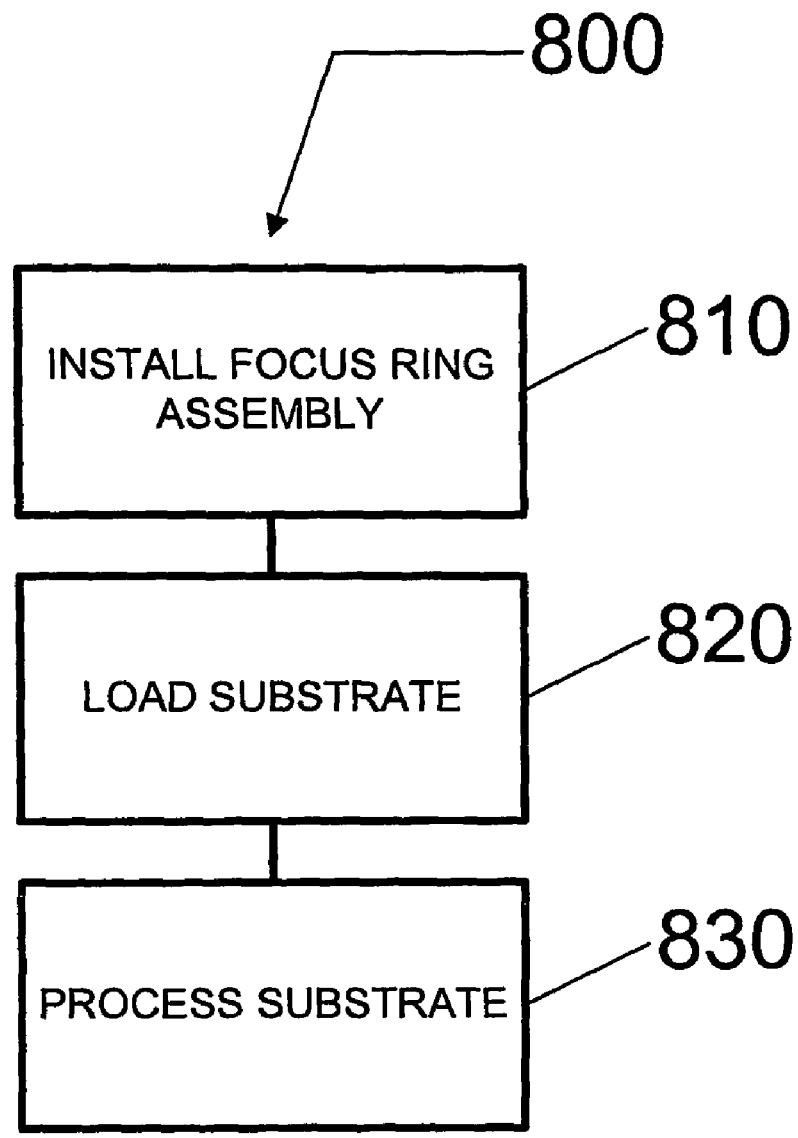
FIG. 9 presents a method of using a focus ring in a plasma processing system according to an embodiment of the present invention.

Referring now to FIG. 9, a method of reducing substrate backside deposition during processing is described. The method is presented in flow chart 800 beginning with step 810, wherein a focus ring assembly comprising a focus ring and a secondary focus ring such as the ones described in FIGS. 3 through 8 is installed in a processing system such as the one described in FIG. 1. The installation can take place during the initial installation of the processing system in a manufacturing environment or anytime thereafter by anyone skilled in the assembly and maintenance of such systems. For example, the focus ring and the secondary focus ring can be installed, thereby replacing a previously used focus ring and secondary focus ring, during maintenance intervals, such as for chamber cleaning, process kit replacement, etc. During installation, the focus ring and the secondary focus ring can be positioned upon an upper surface of the substrate holder. Alternately, the focus ring and/or secondary focus ring can be clamped to the substrate holder using either a mechanical clamping system, or an electrical clamping system as known to those skilled in the art of electrostatic clamping systems.

In step 820, a substrate is loaded into the processing system using techniques known to those skilled in the design of substrate transfer systems. In step 830, the substrate is processed in the processing system. The processing of the substrate can, for example, comprise material processing including either the addition of material to the substrate or the removal of material from the substrate.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A focus ring assembly configured to reduce process effects on the backside of a substrate that is cantilevered beyond an edge of a substrate holder support surface on which the substrate rests, the focus ring assembly comprising:

a focus ring positioned on a step receiving surface of the substrate holder which is axially recessed from the substrate holder support surface and extends radially outward from the edge of the substrate holder support surface, the focus ring comprising:
  a bottom surface which contacts the step receiving surface of the substrate holder,
  a top surface which opposes the bottom surface and is axially positioned at a higher level than the substrate support surface when the focus ring is positioned on the step planar level as a top surface of the substrate, and
  a lip having a lip receiving surface axially located between the bottom surface and top surface of the focus ring, such that the lip receiving surface is located directly below and in opposition to a backside surface of a substrate resting on the substrate support surface of the substrate holder, and an outer radial lip surface positioned radially outward from a peripheral edge of the substrate and extending substantially perpendicularly upward from the lip receiving surface to the top surface of the focus ring such that the peripheral edge of said substrate is substantially parallel to the outer radial lip surface and a clearance space is formed between a cantilevered portion of the substrate and the lip of the focus ring; and
  a secondary focus ring including a bottom most surface positioned on and in contact with the lip receiving surface of the focus ring, the secondary focus ring including an outer radial edge surface extending axially upward from the bottommost surface in contact with the lip receiving surface and positioned radially outward from the peripheral edge of the substrate,
  wherein said focus ring is configured to couple to a substrate holder configured to support a substrate exposed to a process in a processing system, and said secondary focus ring is configured to reduce deposition of material from said process on a backside surface of said substrate.

2. The substrate holder as recited in claim 1, wherein said secondary focus ring comprises a compliant material.

3. The substrate holder as recited in claim 2, wherein said compliant material comprises at least one of silicone rubber, polyimide, and Teflon.

4. The substrate holder as recited in claim 1, wherein said secondary focus ring comprises a rigid material.

5. The substrate holder as recited in claim 4, wherein said rigid material comprises at least one of a ceramic material, silicon, silicon carbide, silicon nitride, silicon dioxide, carbon, sapphire, and alumina.

6. The substrate holder as recited in claim 1, wherein said secondary focus ring comprises silicon having a resistivity less than or equal to 1 Ω-cm.

7. The substrate holder as recited in claim 1, wherein a clearance space comprises an axial clearance space between the lip receiving surface of the focus ring and said backside surface on said substrate, and said secondary focus ring reduces said clearance space.

8. The substrate holder as recited in claim 7, wherein the clearance space comprises a radial clearance space between the peripheral edge of the substrate and the outer radial lip surface of the focus ring said secondary focus ring also reducing the radial clearance space.

9. The focus ring assembly as recited in claim 8, wherein said secondary focus ring eliminates said axial clearance space.

10. The focus ring assembly as recited in claim 1, wherein the outer radial lip surface of the focus ring is positioned radially outward from an outer radial edge surface of the secondary focus ring.

11. The focus ring assembly as recited in claim 1, wherein the outer radial lip surface of the focus ring is positioned radially outward from and in contact with an outer radial edge surface of the secondary focus ring.

12. The focus ring assembly as recited in claim 1, wherein the secondary focus ring has an annular shape and a cross-section of the secondary focus ring has a rectangular shape.

13. The focus ring assembly as recited in claim 1, wherein the focus ring has an annular shape and a cross-section of the secondary focus ring has an L-shape.

14. The focus ring assembly as recited in claim 1, wherein the secondary focus ring is positioned entirely radially outward from the substrate.

15. The focus ring assembly as recited in claim 1, wherein the secondary focus ring includes an upper surface that is substantially planar with a top surface of the substrate.

16. The focus ring assembly as recited in claim 1, wherein the entire secondary focus ring is positioned radially inside of the outer radial lip surface of the focus ring.

17. The focus ring assembly as recited in claim 1, wherein the focus ring extends further radially inward than the secondary focus ring.

18. A focus ring assembly configured to reduce process effects on the backside of a substrate that is cantilevered beyond an edge of a substrate holder support surface on which the substrate rests, the focus ring assembly comprising:
  a focus ring positioned on a step receiving surface of the substrate holder which is axially recessed from the substrate holder support surface and extends radially outward from the edge of the substrate holder support surface, the focus ring comprising:
    a bottom surface which contacts the step receiving surface of the substrate holder,
    a top surface which opposes the bottom surface, the focus ring being dimensioned such that the top surface is axially positioned at a higher level than the substrate support surface and also positioned at substantially a same planar level as a top surface of the substrate when the focus ring is positioned on the step receiving surface of the substrate holder, and the substrate is resting on the substrate holder support surface,
    a lip having a lip receiving surface axially located between the bottom surface and top surface of the focus ring at a position such that the lip receiving surface is located directly below and in opposition to a backside surface of a substrate when the substrate is resting on the substrate support surface of the substrate holder, and an outer radial lip surface positioned radially outward from a peripheral edge of the substrate when the substrate is resting on the substrate holder support surface and extending substantially perpendicularly upward from the lip receiving surface to the top surface of the focus ring at a position such that the peripheral edge of said substrate is substantially parallel to the outer radial lip surface and a clearance space is formed between a cantilevered portion of the substrate and the lip of the focus ring; and
  a secondary focus ring including a bottommost surface positioned on and in contact with the lip receiving surface of the focus ring, the secondary focus ring including an outer radial edge surface extending axially upward from the bottom most surface in contact with the lip receiving surface and positioned radially outward from the peripheral edge of the substrate when the substrate is resting on the substrate holder support surface,
wherein said focus ring is configured to couple to the substrate holder which is configured to support the substrate exposed to a process in a processing system, and said secondary focus ring is configured to reduce deposition of material from said process on the backside surface of said substrate.

19. The focus ring assembly of claim 1, wherein the bottom most surface of the secondary focus ring is supported by the lip receiving surface of the focus ring such that the bottom most surface does not contact the step receiving surface of the substrate holder.

20. The focus ring assembly of claim 18, wherein the bottom most surface of the secondary focus ring is supported by the lip receiving surface of the focus ring such that the bottom most surface does not contact the step receiving surface of the substrate holder.

21. The focus ring assembly of claim 1, wherein at least a portion of the secondary focus ring is configured to reduce a space between the lip receiving surface and the backside surface of the substrate to 0.5 mm or less.

22. The focus ring assembly of claim 18, wherein at least a portion of the secondary focus ring is configured to reduce a space between the lip receiving surface and the backside surface of the substrate to 0.5 mm or less.

* * * * *